USOO9839144B2

United States Patent
Chuang et al.

(10) Patent No.: US 9,839,144 B2
(45) Date of Patent: Dec. 5, 2017

(54) ELECTRONIC DEVICE AND DISPLAY MODULE WITH SENSING ANTENNA

(71) Applicants: AU Optronics Corporation, Hsin-Chu (TW); Jieng Tai International Electric Corp., New Taipei (TW)

(72) Inventors: Tzu-Yu Chuang, Hsin-Chu (TW); Fang-Ching Lee, Hsin-Chu (TW); Chi-Hung Lu, Hsin-Chu (TW); Meng-Ying Hsieh, Hsin-Chu (TW)

(73) Assignees: AU OPTRONICS CORPORATION, Hsin-Chu (TW); JIENG TAI INTERNATIONAL ELECTRIC CORP., New Taipei (TW)

( * ) Notice: Subject to any disclaimer, the term of this patent is extended or adjusted under 35 U.S.C. 154(b) by 503 days.

(21) Appl. No.: 14/267,977

(22) Filed: May 2, 2014

(65) Prior Publication Data
US 2014/0328084 A1 Nov. 6, 2014

(30) Foreign Application Priority Data
May 2, 2013 (CN) .......................... 2013 1 0158439

(51) Int. Cl.
*H05K 5/00* (2006.01)
*H05K 5/02* (2006.01)
(Continued)

(52) U.S. Cl.
CPC ........... *H05K 5/0017* (2013.01); *H01Q 1/243* (2013.01); *H01Q 7/00* (2013.01); *H05K 5/0247* (2013.01);
(Continued)

(58) Field of Classification Search
CPC .... F21S 48/215; F21S 48/1241; F21S 48/115; F21S 48/2237; F21S 48/2243;
(Continued)

(56) References Cited

U.S. PATENT DOCUMENTS

2003/0038751 A1 2/2003 Iwai et al.
2003/0112080 A1 6/2003 Amiot et al.
(Continued)

FOREIGN PATENT DOCUMENTS

CN 1407653 A 4/2003
CN 1433141 A 7/2003
(Continued)

OTHER PUBLICATIONS

English translation of abstract of TW 490880 (published Jun. 11, 2002).
(Continued)

*Primary Examiner* — Stephen F Husar
(74) *Attorney, Agent, or Firm* — McClure, Qualey & Rodack, LLP

(57) ABSTRACT

An electronic device and a display module used therein are provided. The display module includes a display panel, a backlight module and a sensing antenna. The backlight module has a light exit surface and a reflective plate opposite to the light exit surface, and the display panel is stacked on the light exit surface. The sensing antenna is disposed on a surface of the reflective plate opposite to the light exit surface and has a body and two signal connecting terminals connecting the body. The electronic device includes the display module, a system circuit module, and a conductive device. The system circuit module is disposed on a back side of the display module and has a signal connecting parts corresponding to and connecting the signal connecting terminals.

50 Claims, 16 Drawing Sheets

(51) Int. Cl.
*H01Q 1/24* (2006.01)
*H01Q 7/00* (2006.01)
*F21V 8/00* (2006.01)
*H04M 1/02* (2006.01)

(52) U.S. Cl.
CPC ......... *G02B 6/0055* (2013.01); *H04M 1/0266* (2013.01)

(58) Field of Classification Search
CPC ......... F21S 48/2287; B60R 2001/1215; B60Q 3/0203; B60Q 2500/10; B60Q 3/044; B60Q 1/24; B60Q 1/26; B60Q 1/2611; B60Q 1/2661; B60Q 3/002; B60K 2350/203; F21Y 2101/02; G02B 6/001; G02B 6/0055; E05B 17/10; B29L 2031/3005; H05K 5/0017; H05K 5/0247; H04M 1/0266; H01Q 1/243; H01Q 7/00
See application file for complete search history.

(56) References Cited

U.S. PATENT DOCUMENTS

| | | |
|---|---|---|
| 2008/0074334 A1 | 3/2008 | Kang |
| 2010/0171891 A1* | 7/2010 | Kaji ................ A63F 13/06 349/12 |
| 2011/0187688 A1 | 8/2011 | Yamazaki et al. |
| 2012/0050114 A1 | 3/2012 | Li et al. |
| 2012/0220220 A1 | 8/2012 | DeLuca et al. |
| 2013/0038809 A1 | 2/2013 | Hung et al. |
| 2013/0083497 A1 | 4/2013 | Lee et al. |
| 2013/0100124 A1* | 4/2013 | Kim ................ G02B 27/2214 345/419 |

FOREIGN PATENT DOCUMENTS

| | | |
|---|---|---|
| CN | 2692775 Y | 4/2005 |
| CN | 101155473 A | 4/2008 |
| CN | 101901094 A | 12/2010 |
| CN | 102427662 A | 4/2012 |
| CN | 102437405 A | 5/2012 |
| CN | 102714001 A | 10/2012 |
| CN | 102800248 A | 11/2012 |
| CN | 102821567 A | 12/2012 |
| TW | 490880 | 6/2002 |
| TW | M353498 | 3/2009 |
| TW | M443224 | 12/2012 |

OTHER PUBLICATIONS

English translation of abstract of TW M443224 (published Dec. 11, 2012).
English translation of abstract of TW M353498 (published Mar. 21, 2009).
Office Action issued in corresponding Taiwan patent application dated Sep. 18, 2015.
Search Report for PCT/CN2013/000599 dated Feb. 20, 2014.
English translation of abstract of CN 101901094 A (published Dec. 1, 2010).
English translation of abstract and cited paragraph of CN 102800248 A (published Nov. 28, 2012).
English translation of abstract of CN 102821567 A (published Dec. 12, 2012).
English translation of abstract of CN 2692775 Y (published Apr. 13, 2005).

* cited by examiner

ELECTRONIC DEVICE AND DISPLAY MODULE WITH SENSING ANTENNA

BACKGROUND OF THE DISCLOSURE

1. Field of the Disclosure

This disclosure generally relates to a display module having a sensing antenna and an electronic device having the display module.

2. Background

In recent years, the wireless communication approach used between electronic devices is becoming more versatile. Besides the conventional wireless communication approaches such as Wi-Fi, Bluetooth, etc., the Near Field Communication (NFC) technology is getting matured and gradually becomes a practical communication approach applied to electronic devices.

However, the number of components of the electronic device increases as the function of the electronic device becomes more complicated. Limited by the volume design requirement and the user's operation habit, the location where a NFC antenna can be disposed is less flexible.

SUMMARY

In accordance with aspects of the present disclosure to provide a display module, wherein a sensing antenna could be included.

In accordance with embodiments of the present disclosure to provide a display module and an electronic device which are capable of sensing the sensing antenna from a display surface.

The display module includes a display panel, a backlight module, and a sensing antenna. The backlight module has a light exit surface and a reflective plate opposite to the light exit surface, wherein the display panel is stacked on the light exit surface for receiving the back light emitted from the light exit surface. At least one sensing antenna has a body and two signal connecting terminals connecting the body and is disposed on a surface of the reflective plate facing away from the light exit surface, i.e. a surface of the reflecting plate opposite to the light guide plate.

The electronic device includes said display module, a system circuit module, and conductive transfer units. The system circuit module is disposed on the back side of the display module, i.e. the opposite side of the display surface. The system circuit module has signal connecting parts disposed corresponding to the signal connecting terminals of the sensing antenna. The conductive transfer devices are disposed between the system circuit module and the sensing antenna, wherein the conductive transfer devices are respectively connect the corresponding signal connecting parts and the corresponding signal connecting terminals to transfer signal.

The present disclosure also provides a method for decreasing interference to a sensing antenna caused by a change in capacitance when operating the display panel. The method includes determining whether the sensing antenna sense a change in capacitance of the display panel; when a change in capacitance of the display panel is sensed, outputting a signal to a matching circuit of the sensing antenna; and modulating the capacitance of a variable capacitor of the matching circuit in accordance with the signal to make a frequency or a bandwidth of the sensing antenna back to an original working frequency band, hence to reduce the effect caused the change in capacitance of the display panel.

DETAILED DESCRIPTION

This disclosure generally relates to a display module having a sensing antenna and an electronic device having the display module. The display module preferably includes non-self-luminous and self-luminous display module. The non-self-luminous display module includes but not limited to a liquid crystal display module, an electro-wetting display module, or an electro-phoretic display module, wherein the non-self-luminous display module includes a backlight source. The self-luminous display module includes but not limited to an organic luminous display module or an inorganic luminous display module, wherein the self-luminous display module generally does not include a backlight source. The electronic device preferably includes but not limited to a mobile phone, an electronic watch, an electronic glasses, a handheld game console, an electronic name card, a digital photo frame, a tablet, a laptop, a digital camera, an on-board display device (on car display device), a multimedia television, a personal computer monitor, a stereoscopic display device, a multi-view display device, a navigator, an electronic mirror, an electronic display window, an electronic poster, or other personal or public electronic devices. The above electronic devices generally have electronic components including but not limited to a control unit, an operating unit, a processing unit, an inputting unit, a memory unit, a driving unit, a luminous unit, a protection unit, a sensing unit, a detecting unit, a photoelectric conversion unit, a photovoltaic unit, or other functional units, or a combination of at least two above units based on the type of the above display module.

The sensing antenna in the present disclosure includes an antenna for receiving or transmitting signal or energy, such as a near field communication (NFC) antenna, an inductive charging antenna or other different types of antenna. Moreover, preferably, the sensing antenna could be active type or passive type. Taking the NFC antenna as an example, the active type actively sends out its radio frequency field to identify and read/write other NFC equipment. The passive type preferably does not actively send out its radio frequency field, but passively responds to the radio frequency field sent by other NFC equipment.

Figure 2:
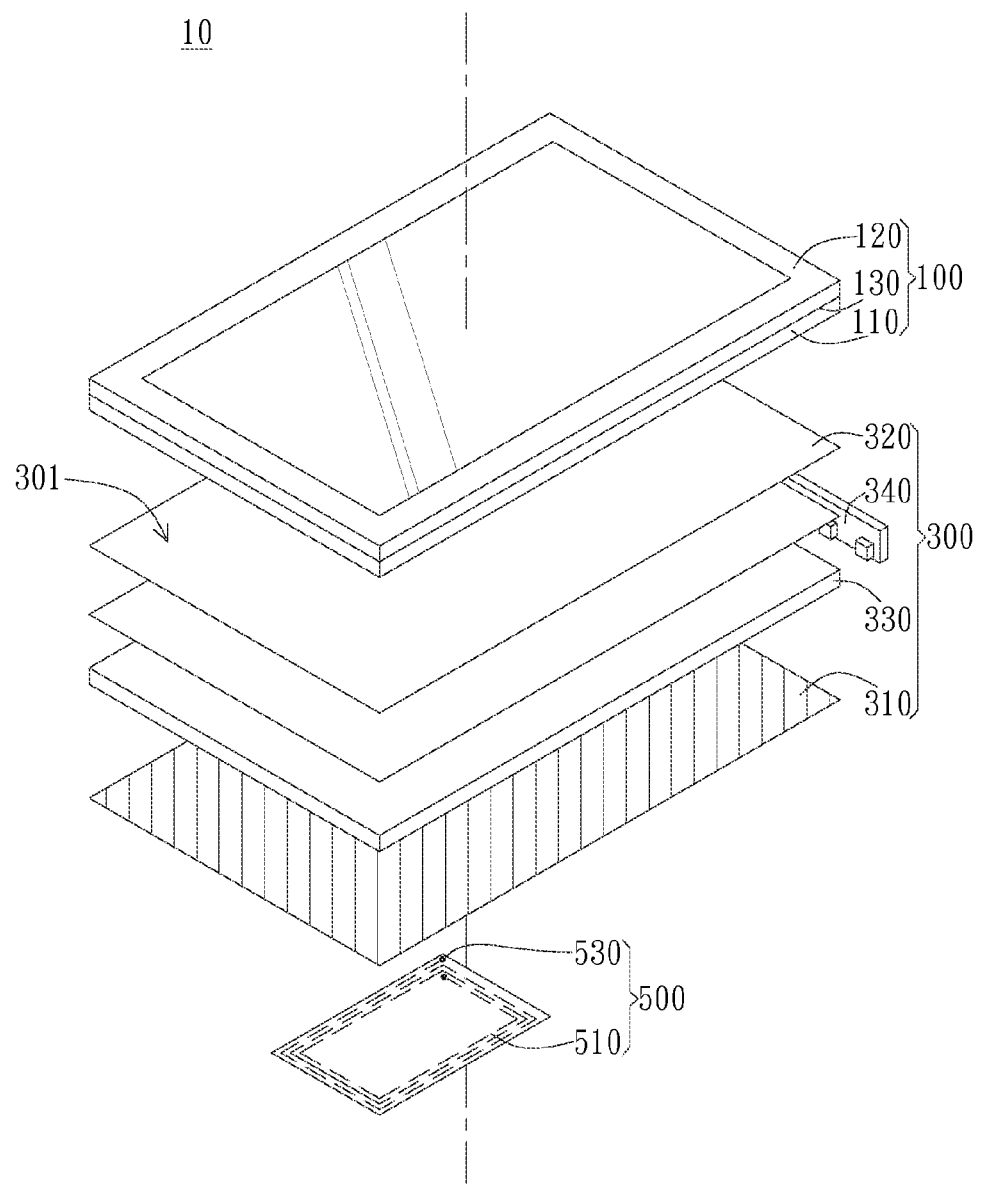
FIG. 2 is an exploded view of the embodiment of the display module of the present disclosure.

As the embodiment shown in FIG. 2, the display module 10 includes a display panel 100, a backlight module 300, and a sensing antenna 500. The display panel 100 preferably includes a first substrate 110, a second substrate 120, and a display medium layer 130 disposed between the first substrate 110 and the second substrate 120. The first substrate 110 preferably has a pixel electrode layer or other control circuit module for controlling the display medium layer 130. The outer surface of the second substrate forms a display surface 101 (as shown in FIG. 3B). A color filter layer (not shown) is preferably formed on the second substrate 120, but not limited thereto. In other embodiments, the color filter layer can be disposed between the display medium layer 130 and the first substrate 110, which can be referred to "array on color filter" or "color filter on array". In the embodiment, the display panel 100 is preferably a liquid crystal panel; hence the display medium layer 130 is a liquid crystal layer, wherein the electrical field that drives the liquid crystal layer can be horizontal electrical field and/or vertical electrical field. In different embodiments, however, the display medium layer 130 could be an electro-phoretic display layer, an electro-wetting display layer, or other non-self-luminous medium layers. The backlight module 300 has a light exit surface 301 and a reflective plate 310 disposed opposite to the light exit surface 301, wherein the display panel 100 is stacked on the light exit surface 301 in a contact or non-contact manner for receiving the backlight emitted from the light exit surface 301. The backlight module 300 could be a direct light design or a side-lit design. In this embodiment, the backlight module takes the side-lit design and includes an optical film 320, a light guide plate 330, a light source 340, and the reflective plate 310. The optical film 320 is stacked on the light guide plate 330 and is selected from a polarizing film, a brightness enhancement film, a diffusing film, or other suitable optical films, or a combination of at least two of the above films. The light source 340 is disposed at the side of the light guide plate 330, wherein the reflective plate 310 is disposed on the bottom surface (not shown) of the light guide plate 330, and the side connects the light exit surface 301 and the bottom surface. The light generated by the light source 340 enters the light guide plate 330 from the side surface, exits from the top surface of the light guide plate 330 after being reflected, and exits the light exit surface 301 after passing through the optical film 320. In other words, in this embodiment, the light exit surface 301 is formed on the outer surface of the optical film 320 closest to the display panel 100. Besides, a portion of light exited from the bottom surface of the light guide plate 330 can be reflected back into the light guide plate 330 by the reflective plate 310.

Figure 3A:
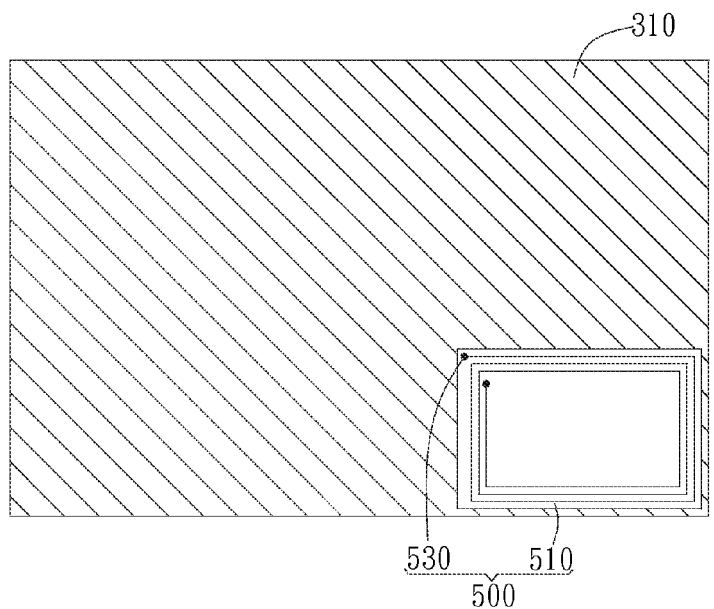
FIG. 3A is a rear view of the embodiment shown in FIG. 2.
Figure 3B:
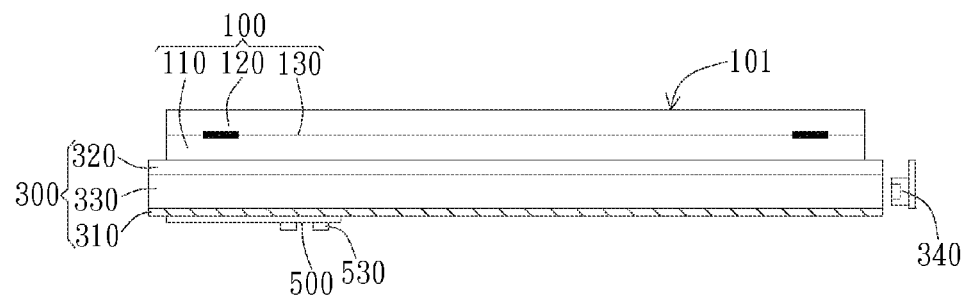
FIG. 3B is a side view of the embodiment shown in FIG. 2.

As shown in FIGS. 2, 3A, and 3B, the sensing antenna 500 includes a body 510 and two signal connecting terminals 530 connecting the body 510. The sensing antenna 500 is preferably a loop coil and can be formed on a flexible circuit board or a printed circuit board. The sensing antenna 500 also can be directly formed on a desired substrate or plate by different processes. The sensing antenna 500 in this embodiment is disposed on a surface of the reflective plate 310 that faces away from the light exit surface 301, i.e. a surface of the reflective plate 310 opposite to the light guide plate 330. In other words, the reflective plate 310 has a first surface (or namely top surface) and a second surface (or namely bottom surface) is opposite to the first surface, wherein first surface of the reflective plate 30 faces and closest to the light guide plate 330 and second surface of the reflective plate 30 not faces to and far away the light guide plate 330. The reflective plate 310 is made of a polymer material substrate coated with other color paint or a polymer single/multi-layer for refracting/reflecting light. The polymer material includes Poly(Methyl methacrylate) (PMMA), Polycarbonate (PC), (Methyl methacrylate)Styrene (MS), Poly(Ethylene Terephthalate) (PET), Poly(Ethylene Naphthalate) (PEN), PolyStyrene (PS), Polypropylene (PP), or other suitable materials or a combination thereof, or a copolymer thereof, wherein the properties of the above material can be found in the MSDS (material safety data sheet). For example, preferably, the polymer single/multi-layer for refracting/reflecting could be a single layer of Poly(Ethylene Terephthalate) or a multiple layer of Polypropylene and Poly(Ethylene Terephthalate). The reflective plate does not include metal film or alloy film, so that the reflective plate 310 will not shield the sensing electromagnetic wave (i.e. magnetic field line) of the sensing antenna 500. When a sensing device approaches the display surface 101 and undergoes sensing to transfer or receive data, it can be regarded as the sensing antenna 500 passing through the display module 100 and leaving the display surface 101. In this embodiment, since no housing (or namely rear shell, or namely outer shell) is disposed on the outer side of the reflective plate 310, the sensing antenna 500 is not shielded by the backlight module 300 when viewing from the back surface of the backlight module 300 (as shown in FIG. 3A), wherein at least a portion of the outer surface of the sensing antenna 500 is exposed outside the backlight module 300. That is, the sensing antenna 500 can be seen from the back side of the display module before it is assembled with other units of the electronic device. The inner surface of the sensing antenna 500 is a surface of the sensing antenna 500 that contacts the reflective plate 310, i.e. inner surface of the sensing antenna 500 contacts the bottom surface of the reflective plate 310. The outer surface of the sensing antenna 500 is a surface of the sensing antenna 500 that does not contact the reflective plate 310, i.e. outer surface of the sensing antenna 500 not contact bottom and top surfaces of the reflective plate 310. Wherein inner surface of the sensing antenna 500 opposites to outer surface of the sensing antenna 500. As the side view shown in FIG. 3B, the sensing antenna 500 preferably protrudes from the surface of the reflective plate 310 (such as bottom surface of the reflective plate 310), and more preferably protrudes from the bottom surface of the whole backlight module 300. Moreover, for the convenience of signal connection of the signal connecting terminal of the sensing antenna with the system terminal after assembly, in the preferred embodiment, the signal connecting terminals 530 of the sensing antenna 500 are disposed on a surface of the sensing antenna 500 that faces outward or is exposed.

For an active sensing antenna 500, the above design decreases the metal shielding of the sensing antenna 500 on the back side. Hence there is less interference to the radio frequency field generated by the sensing antenna 500. For a passive sensing antenna 500, this kind of design also reduces the probability of being interfered with the radio frequency field emitted by an external communication apparatus. In other embodiments, the outer surface of the sensing antenna 500 is shielded by a shielding device, i.e. a shielding device is disposed under the sensing antenna 500 and the sensing antenna 500 is disposed between the reflective plate and the shielding device; it can be regarded as the sensing antenna 500 passing through the display module 100 and leaving the display surface 101 when a sensing device approaches the display surface 101 and undergoes sensing to transfer or receive data. At this time, the strength of the sensing magnetic field line leaving the display surface is larger than the strength of the sensing magnetic field line living the shielding device (e.g. the rear shell). Though the sensing magnetic field lines exit both over and under the sensing antenna 500, for the sensing magnetic field line over the sensing antenna 500, the sensing magnetic field line under the sensing antenna 500 destructively interferes and weakens the sensing magnetic field line over the sensing antenna 500 no matter whether the sensing magnetic field line under the sensing antenna 500 is reflected by other units or not. Therefore, the sensing magnetic field lines over and under the sensing antenna 500 should be considered separately, it is not instead of being treated interchangeably or equally. The material of the shielding device (or namely shielding unit) includes reflective material, i.e. light tight conductive material, such as metal or metal alloy. The shielding device includes a back shell (as shown in FIG. 5C, could be an outer shell or a rear shell of an electronic device), a battery, a rigid printed circuit board, or other units, or a combination of at least two of the above. The back shell is preferably the outmost shell (or referred as the outmost casing) without any other shell or frame; thus the battery and the rigid printed circuit board or other units are disposed under the sensing antenna 500 and between the back shell 400 and the sensing antenna 500. The sensing antenna 500 is disposed between the display module 100 and the shielding unit.

Figure 4A:
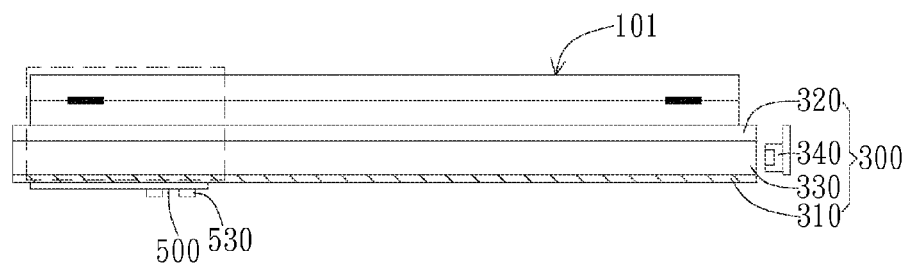
FIG. 4A is a schematic view of the range for calculating the metal projection coverage rate.
Figure 4B:
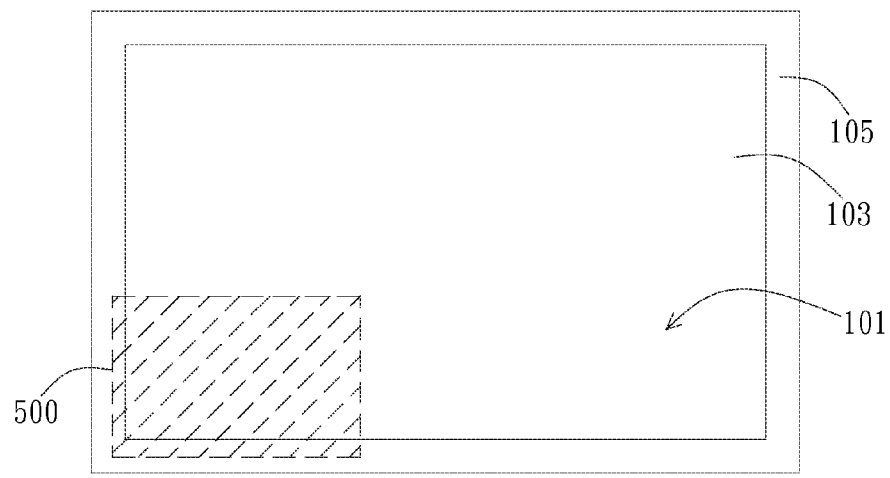
FIG. 4B is a schematic view of the projection range of the sensing antenna.
Figure 4C:
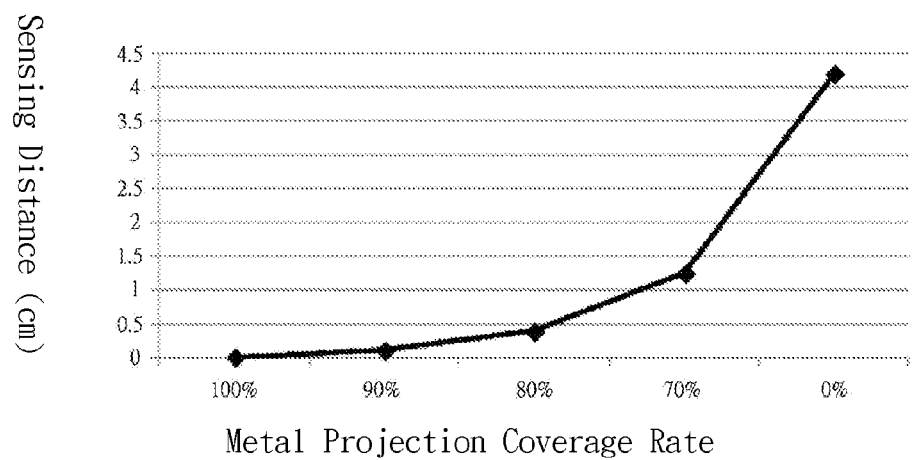
FIG. 4C is a schematic view showing the relation between the sensing distance and the metal projection coverage rate.

In the preferred embodiment, a portion of the display module 100 is between the display surface 101 and the body 510 of the sensing antenna 500 (as the region labeled by the dotted line shown in FIG. 4A), so that a portion of the display panel overlaps the sensing antenna and has an overlapping area of a projection on a plane, wherein a metal projection coverage rate (metal projection coverage percentage) of the metal layer in the overlapping area is not more than about 90%, preferably lower than about 70%. The metal projection coverage rate (Ac) preferably refers to, when a display panel of the display module 100 having a display surface with a metal layer is projecting on a virtual plane, the ratio of the projection area A2 of the metal layer in the overlapping area on the virtual plane to the projection area A1 of the sensing antenna 500 on the virtual plane in percentage (%), i.e. Ac=(A2/A1)×100%. The display surface includes a display area and a peripheral circuit area, e.g. the surface of the display panel faces the user. In other words, the display panel has the display area and the peripheral circuit area. The metal layer preferably refers to a signal transfer device/line (wire) in the display module made of reflective material, i.e. non-transparent conductive material, e.g. made of metal or metal alloy material. In general, the signal transfer device/line (wire) at least includes scanning line, data line, capacitor line, connecting wire, contact pad, transistor, or other devices or lines (e.g. power wire, reference potential wire, reflective electrode, repairing wire, capacitor electrode, or other devices or wires). In other words, the numerator of the metal projection coverage rate (Ac) refers to the projection area (A2) of the metal layer (i.e. signal transfer device/wire) in the overlapping area of the display module 100 on the virtual plane, wherein the overlapping area refers to the region of the display module 100 that overlaps the body 510. The projection area (A2x) of the transparent conductive or non-conductive material in the overlapping area of the display module 100 on the virtual plane along with the other projection area (Ax, as shown in FIG. 4B) of the display module 100 that is not in the overlapping area or does not overlap the body 510 are ignored. The denominator of Ac refers to the area (A1) of the sensing antenna projecting on the virtual plane. In this embodiment, As shown in FIG. 4B, taking a perspective view like X-ray or other approach at the display module 100 from the normal direction of the display surface 101, the ratio of the projection area of the metal layer in the projecting region (as shown by the dotted line) of the sensing antenna 500 to the projection area of the projecting region of the sensing antenna 500 in percentage (%) is defined as the metal projection coverage rate. Inside the display area 103, the display panel 100 includes pixel electrode layer, liquid crystal layer, color filter layer, etc. In the peripheral circuit area 105, the display panel 100 includes one or more layers of signal transfer wire. After the projection observation, the projection area of the metal area (layer) of the overlapping portion of each layer will not be calculated repetitiously. In this embodiment, taking a sensing antenna 500 overlapping a portion of the display area 103 and a portion of peripheral circuit area 105 as an example, the numerator of the metal projection coverage rate (Ac) equals the projection area (A21) of the metal layer (i.e. signal transfer device/wire) in a portion of the display area 103 that overlaps the body 510 and projects on the virtual plane pluses the projection area (A22) of the metal layer (i.e. signal transfer device/wire) in a portion of the peripheral circuit area 105 that overlaps the body 510 and projects on the virtual plane. The projection area (A2x) of the transparent conductive or non-conductive material in the display module 100 and the peripheral circuit area 105 that overlaps the body 510 and projects on the virtual plane along with the other projection area (Ax, as shown in FIG. 4B) of the display module 100 not overlapping the body 510 are ignored. The denominator of Ac refers to the area (A1) of the sensing antenna projecting on the virtual plane. That is Ac=(A2/A1)×100%, wherein A2=A21+A22. In other embodiments, the sensing antenna 500 only overlaps the display area 103, the numerator of the metal projection coverage rate (Ac) is the projection area (A21) of the metal layer (i.e. signal transfer device/wire) in the portion of the display area 103 that overlaps the body 510 and projects on the virtual plane, wherein the projection area (A2x) of the transparent conductive or non-conductive material in the display module 100 that overlaps the body 510 and projects on the virtual plane along with the other projection area (Ax, as shown in FIG. 4B) of the display module 100 not overlapping the body 510 are ignored. The denominator of Ac refers to the area (A1) of the sensing antenna projecting on the virtual plane. That is Ac=(A2/A1)×100%, wherein A2=A21. Alternatively, the sensing antenna 500 only overlaps the peripheral circuit area 105, the numerator of the metal projection coverage rate (Ac) is the projection area (A22) of the metal layer (i.e. signal transfer device/wire) in the portion of the peripheral circuit area 105 that overlaps the body 510 and projects on the virtual plane, wherein the projection area (A2x) of the transparent conductive or non-conductive material in the peripheral circuit area 105 that overlaps the body 510 and projects on the virtual plane along with the other projection area (Ax, as shown in FIG. 4B) of the display module 100 not overlapping the body 510 are ignored. The denominator of Ac refers the area (A1) of the sensing antenna projecting on the virtual plane. That is Ac=(A2/A1)×100%, wherein A2=A22. Moreover, when the sensing antenna is a loop coil, its projection area refers to the total area of the loop coil and the area surrounded by the loop coil. As the test data shown in FIG. 4C, when the metal projection coverage rate of the corresponding area between the sensing antenna 500 and the display surface 101 is less than about 90%, it is able to sense the sensing antenna 500 and undergoes transferring data or energy at the position about 0.1 cm away from the display surface. When the metal projection coverage rate of the corresponding area between the sensing antenna 500 and the display surface 101 is less than about 70%, it is able to sense the sensing antenna 500 and undergoes transferring data or energy at the position about 1 cm away from the display surface. It is declared that the metal projection coverage rate mentioned in this embodiment could be used in the following embodiments.

Figure 5A:
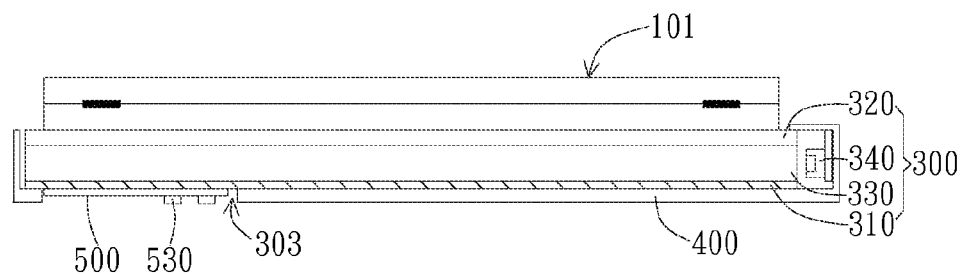
FIG. 5A is a schematic view of the embodiment of the display module having a rear shell.

FIG. 5A shows a modified embodiment of the embodiment shown in FIG. 2. In this embodiment, the display module 100 further includes a rear shell 400 covers the surface of the reflective plate 310 that faces away from the light exit surface 301. The rear shell 400 preferably refers to an outmost housing of the display module 100 or a metal part which increases the strength of the display module 100. In a different embodiment, however, the rear shell 400 could be made of other material. In this embodiment, an opening 303 is preferably formed in the rear shell 400 at a position of the rear shell 400 that corresponds to the sensing antenna 500 to at least partially expose the surface of the sensing antenna. Preferably, the opening 303 totally exposes the surface of the sensing antenna 500. In other words, when viewing from the rear shell 400, at least a portion of the surface of the sensing antenna 500 could be seen through the opening 303. Accordingly, though the sensing antenna 500 does not protrude out of the rear shell 400, the signal receiving or transmitting of the sensing antenna 500 is not influenced. In different embodiments, the sensing antenna 500 can protrude out of the rear shell via the opening 303 to facilitate signal connection of the signal connecting terminal 530 with the system terminal after assembly. In this embodiment, the sensing antenna 500 can be disposed between the shielding device (unit) and the reflective plate 310. For not influencing the signal receiving or transmitting of the sensing antenna 500, in addition to the rear shell having an opening, other shielding units, e.g. battery and/or rigid printed circuit board, will not overlap the sensing antenna 500. Therefore, besides the sensing electromagnetic radiation (or called sensing magnetic field line) of the sensing antenna 500 is able to pass through the display module 100 and leave the display surface 101 when the sensing device approaches the display surface 101 and undergoes sensing to transfer or receive data, the sensing electromagnetic radiation (or called sensing magnetic field line) of the sensing antenna 500 is able to pass through the rear shell 400 and leave when the sensing device approaches the rear shell 400 and undergoes sensing to transfer or receive data, hence to increase the sensing strength and the user's convenience.

Figure 5B:
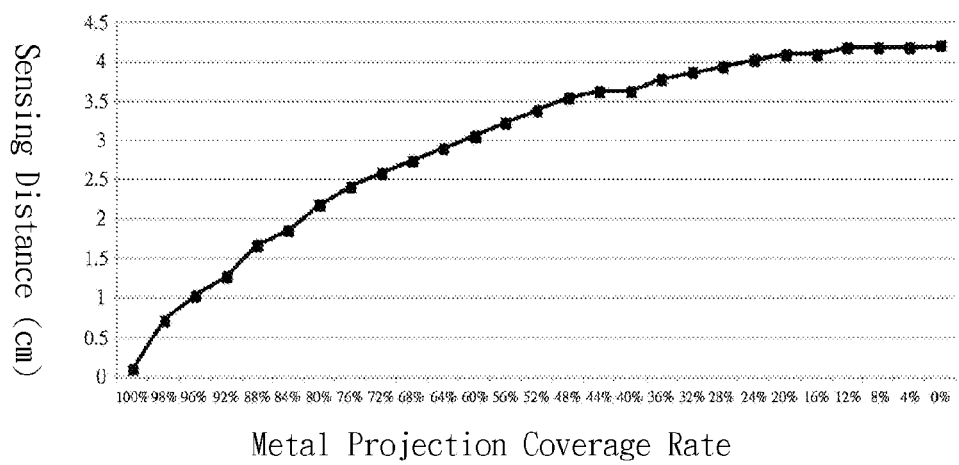
FIG. 5B is a schematic view showing the relation between the sensing distance and the metal projection coverage rate.
Figure 5C:
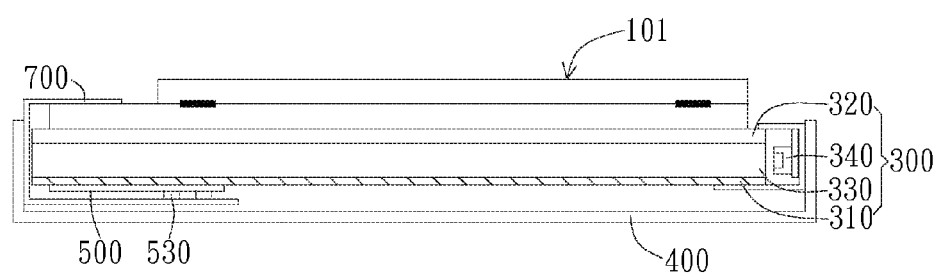
FIG. 5C is a schematic view of another embodiment of the display module having a rear shell.

In different embodiments, considering the effect of the size of the opening 355 of the rear shell 400 on the sensing antenna 500, it is required to design the percentage of exposure of the sensing antenna 500 by the opening, i.e. design in accordance with the metal projection coverage rate (Ac). The metal projection coverage rate (Ac) equals to (A2/A1)×100%. The numerator is the projection area (A2) of the rear shell 400 that overlaps the body 510 and projects on the virtual plane, wherein the denominator refers to the area A1 of the sensing antenna projecting on the virtual plane. That is Ac=(A2/A1)×100%. The other projection area (Ax) of the rear shell 400 projecting on the virtual plane and not overlapping the body 510 is ignored. For not influencing the signal receiving or transmitting of the sensing antenna 500, in addition to the rear shell having an opening, other shielding devices (units), e.g. battery and/or rigid printed circuit board, do not overlap the sensing antenna 500. In other embodiments, the rear shell 400 could have no opening 303, wherein the material of the rear shell is selected from materials containing no metal or metal alloy, e.g. glass or polymer. At this time, the position of the shielding unit (e.g. battery and/or rigid printed circuit board) disposed must be taken into consideration with designing the percentage (%) shielded by the shielding unit of the sensing antenna 500, i.e. designing with the metal projection coverage rate (Ac). The metal projection coverage rate (Ac) is equal to (A2/A1)×100%. The numerator is the projection area (A2) of a portion of the shielding unit that overlaps the body 510 and projects on the virtual plane, wherein the denominator refers to the area A1 of the sensing antenna 500 projecting on the virtual plane. That is Ac=(A2/A1)×100%, wherein A2=A21+A22. The other projection area (Ax) of the shielding unit projecting on the virtual plane and not overlapping the body 510 is ignored. In other words, the projection area of at least one of the battery or the rigid printed circuit board of the shielding unit projecting on the virtual plane and overlapping the body 510 are respectively A21 and A22. When the battery and the printed circuit board both overlap the body 510, A2=A21+A22. When only one of the battery and the printed circuit board overlaps the body 510, A2=A21 or A2=A22. The metal projection coverage rate of the above two embodiments described in this paragraph is preferably lower than about 98%, more preferably lower than about 96%. As the test data shown in FIG. 5B, when the metal projection coverage rate of the projection area on the shielding unit is less than about 98%, it is able to sense the sensing antenna 500 and undergoes transferring data or energy at the position about 0.1 cm away from the display surface. When the metal projection coverage rate of the projection area on the shielding unit is less than about 96%, it is able to sense the sensing antenna 500 and undergoes transferring data or energy at the position about 1 cm away from the display surface.

FIG. 5C shows another modified embodiment of the embodiment shown in FIG. 2. In this embodiment, in addition to the rear shell 400, the display module 10 further includes a signal connecting circuit module 700 connecting the display panel 100 and providing signal to the display panel 100 for displaying image. The signal connecting circuit module 700 is preferably made of flexible circuit board, wherein one end connects the display panel 100; the other end is bent and disposed between the sensing antenna 500 and the rear shell 400. With this configuration, the sensing antenna 500 can be slightly isolated from the rear shell 400; hence the actively emitting or passively responding of radio frequency field or sensing magnetic field by the sensing antenna 500 is less influenced by the metal component (layer) in the rear shell. Therefore, when a sensing device approaches the display surface 101 and undergoes sensing to transfer or receive data, the sensing magnetic field line of the sensing antenna 500 is able to leave the display surface of the display panel 100, hence to increase the sensing effect. For making a sensing device approach closer to the rear shell and undergo sensing to transfer or receive data, the sensing magnetic field line of the sensing antenna 500 is able to leave the rear shell 400 side. Besides, in the preferred embodiment, the signal connecting terminal 530 is able to electrically connect the connecting wire of the signal connecting circuit module 700 via contact, for transferring message to the system terminal via the signal connecting circuit module 700.

Figure 6A:
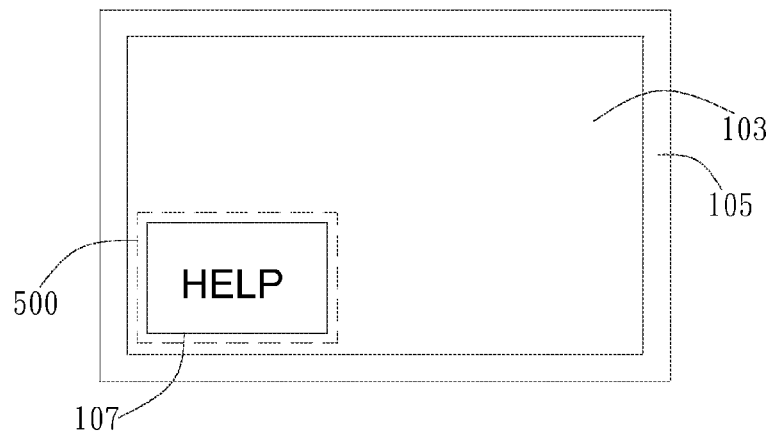
FIG. 6A is a schematic view showing the relation between the sensing antenna on the display surface and the projection location on the display surface.
Figure 6B:
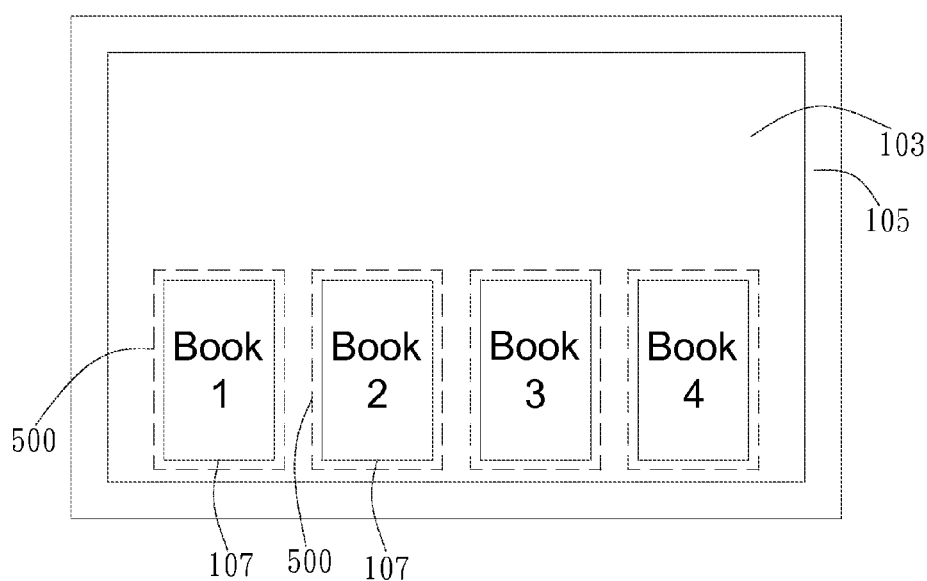
FIG. 6B is another schematic view showing the relation between the sensing antenna on the display surface and the projection location on the display surface.

As shown in FIG. 6A, a display area 103 and a peripheral circuit area 105 surrounding the display area 103 can be defined or divided on the display panel 100. The projection location of the sensing antenna 500 on the display surface 101 could be only in the display area 103, only in the peripheral circuit area 105, or in both the display area 103 and the peripheral circuit area 105. Besides, the image contents of the display panel could relate to the projection location of the sensing antenna 500 in the display area 103. For example, it can be designed in the image content of the display panel 100 to display specific content at a corresponding location 107 of the sensing antenna 500 for notifying the user to use an external sensing device for sensing to receive or transfer data; or a system terminal processing device connected to the sensing antenna 500 can undergo next process accordingly when the user uses the external sensing device to sense at the corresponding location 107 for receiving or transmitting data. For an embodiment having larger sized display panel 100, as shown in FIG. 6B, a plurality of sensing antennas 500 can be disposed on the back side to correspond a plurality of corresponding locations 107; thus the displayed image has different contents at different corresponding positions for the user to select. When the user makes selection to sense at one corresponding location 107, the system terminal processing device gets the selection of the user in accordance with the response of the sensing antenna 500 for undergoing further process.

Figure 7A:
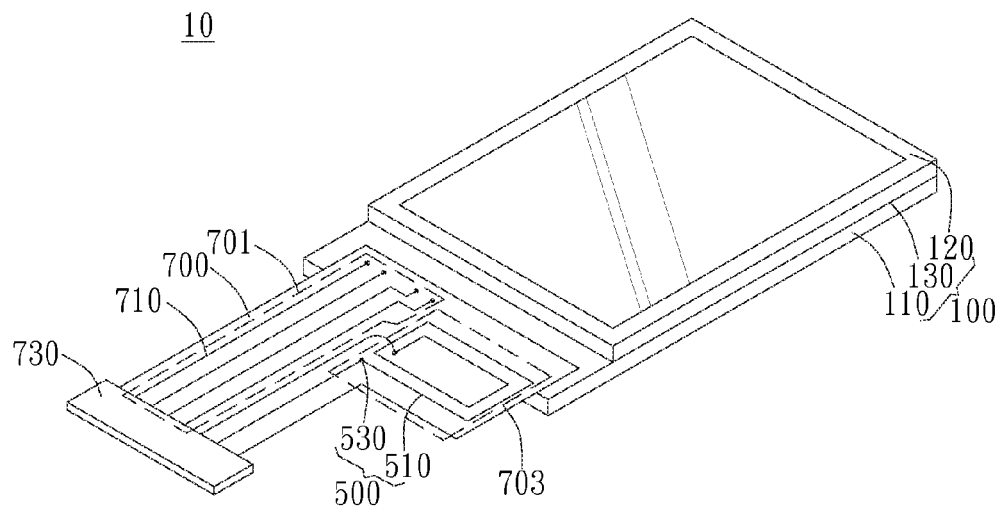
FIG. 7A is a schematic view of the embodiment of the display module including a signal connecting circuit module.

FIG. 7A shows another embodiment of the display module of the present disclosure. In this embodiment, the display module 10 includes a display panel 100, a signal connecting circuit module 700, and a sensing antenna 500. The display panel 100 could be a non-self-luminous panel or a self-luminous panel. The display panel 100 preferably includes a first substrate 110, a second substrate 120, and a display medium layer 130 disposed between the first substrate 110 and the second substrate 120. The display medium layer 130 could be a non-self-luminous material layer such as a liquid crystal layer, an electro-phoretic display layer, or an electro-wetting display layer. The display medium layer 130 could be a self-luminous material layer, such as organic luminous material layer or inorganic luminous material layer. The signal connecting circuit module 700 connects the display panel 100 with signal and has a plurality of driving signal wires 710 for transferring signals to the display panel 100 to display image. The signal connecting circuit module 700 is preferably made of flexible circuit board and electrically connects a side end of the display panel 100. In different embodiments, however, the signal connecting circuit module 700 could be made of hard printed circuit board (or called rigid printed circuit board). Moreover, the signal connecting circuit module 700 includes a system terminal connector 730 electrically connecting a driving signal wire 710 at one end away from the display panel 100 for receiving control signal from a signal source and transferring it to the display panel 100.

Figure 7B:
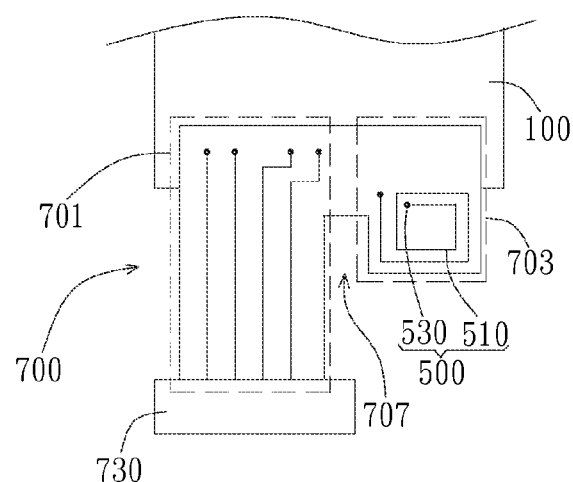
FIGS. 7B to 7E are variant embodiments of the embodiment of FIG. 7A.
Figure 7C:
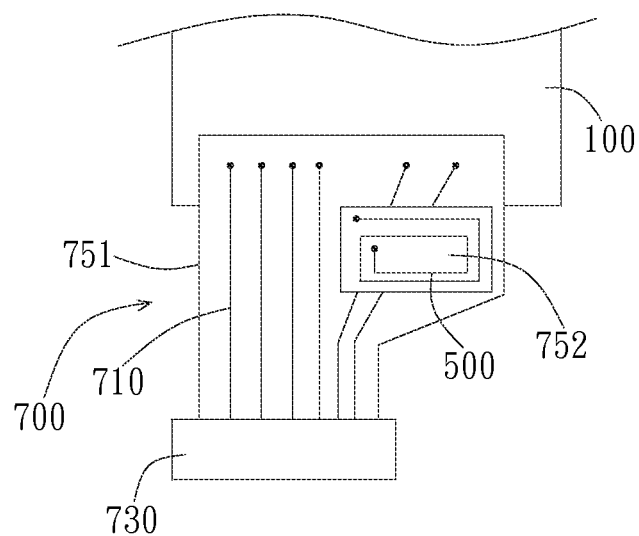
Figure 7D:
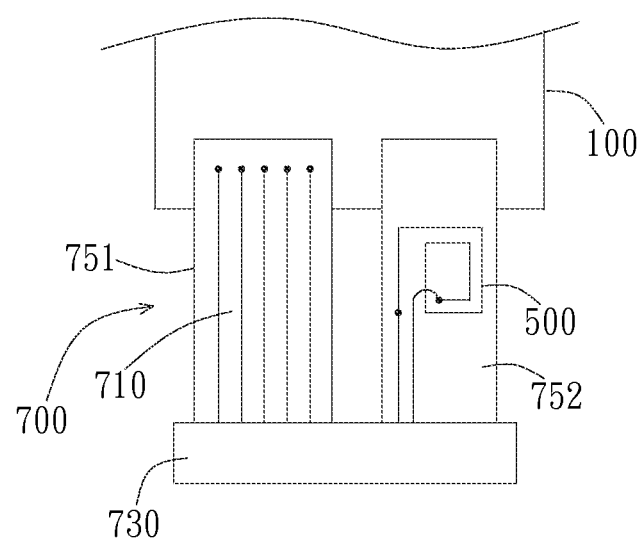

As shown in FIG. 7A, the sensing antenna 500 is disposed on the signal connecting circuit module 700 and has a body 510 and a signal connecting terminal 530. The sensing antenna 500 is electrically insulated from the driving signal wires 710 for decreasing interference to each other. In this embodiment, two areas can be divided on the signal connecting circuit module 700: a driving signal circuit area 701 and a sensing antenna area 703. The driving signal wires 710 and the sensing antenna 500 are respectively formed as conductive wires in the driving signal circuit area 701 and the sensing antenna area 703. Besides, the sensing antenna 500 electrically connects the system terminal connector 730 for sharing (or namely co-using) the system terminal connector 730 with the driving signal circuit area 701 to transfer signal. FIGS. 7B-7D show modified embodiments of the embodiment shown in FIG. 7A. As the embodiment shown in FIG. 7B, a gap 707 is formed between the driving signal circuit area 701 and the sensing antenna area 703 for isolating the driving signal circuit area 701 from the sensing antenna area 703 to further decrease the electric magnetic interference between each other.

As the modified embodiment shown in FIG. 7C, the signal connecting circuit module 700 includes a first circuit board 751 and a second circuit board 752. The driving signal wires 710 are disposed on the first circuit board 751, wherein the sensing antenna 500 is first formed on the second circuit board 752 and then attached to or adhered to the first circuit board 751. The second circuit board 752 is at least a portion in the projection of the first circuit board, i.e. the second circuit board 752 at least partially overlaps the first circuit board. With this design, the sensing antenna 500 and the driving signal wires 710 are disposed in different layers and have a flexible circuit board for isolation. On the other hand, since the sensing antenna 500 is disposed on the signal connecting circuit board 700 by attaching, the design of the driving signal wires 710 is simpler; thus the area of the signal connecting circuit board 700 can be reduced.

As the modified embodiment shown in FIG. 7D, the signal connecting circuit module 700 further includes a first circuit board 751 and a second circuit board 752. The driving signal wires 710 are disposed on the first circuit board 751 while the sensing antenna 500 is formed on the second circuit board 752. A gap exists between same ends of the first circuit board 751 and the second circuit board 752 for separating the first circuit board 751 from the second circuit board 752, wherein they respectively connect the display panel 100. With this design, the electric magnetic interference between the driving signal wire 710 and the sensing antenna 500 can be effectively reduced.

Figure 7E:
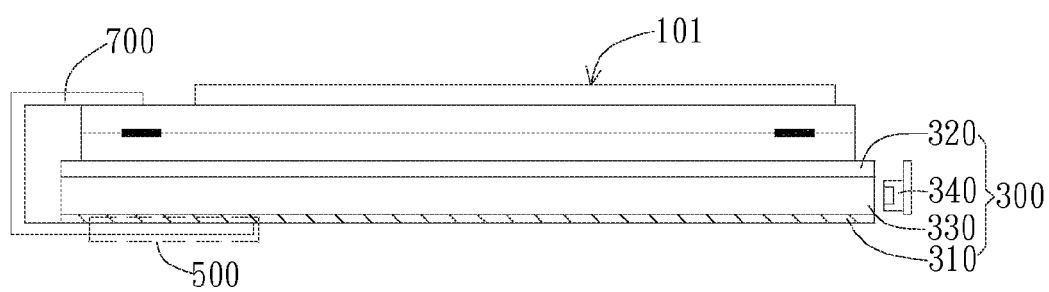

The signal connecting circuit module 700 is preferably bent to (or namely folded to) the back side of the display panel 100 for reducing the size of the display module. As the embodiment shown in FIG. 7E, the panel in the display module 10 is a liquid crystal display panel and has a backlight module 300 stacked on the display panel 100; hence the signal connecting circuit module 700 could be bent to the back side of the backlight module 300. A backlight module is not necessary if the panel in the display module is a self-luminous panel; thus the signal connecting circuit module 700 is preferably bent to the back side of the display panel 100. As mentioned above, the portion of the backlight module 300 and the display panel 100 between the display surface 101 and the body 510 of the sensing antenna 500 or the portion of the display panel 100 in front of the body 510 of the sensing antenna 500 has a portion of the display panel overlapping the sensing antenna and has an overlapping area of the projection on a plane, wherein a metal coverage rate of the metal layer in the overlapping area is lower than 90%, more preferably lower than 70%. The definition and description of the metal projection coverage rate can be found in the description regarding FIGS. 4A and 4B.

Figure 8A:
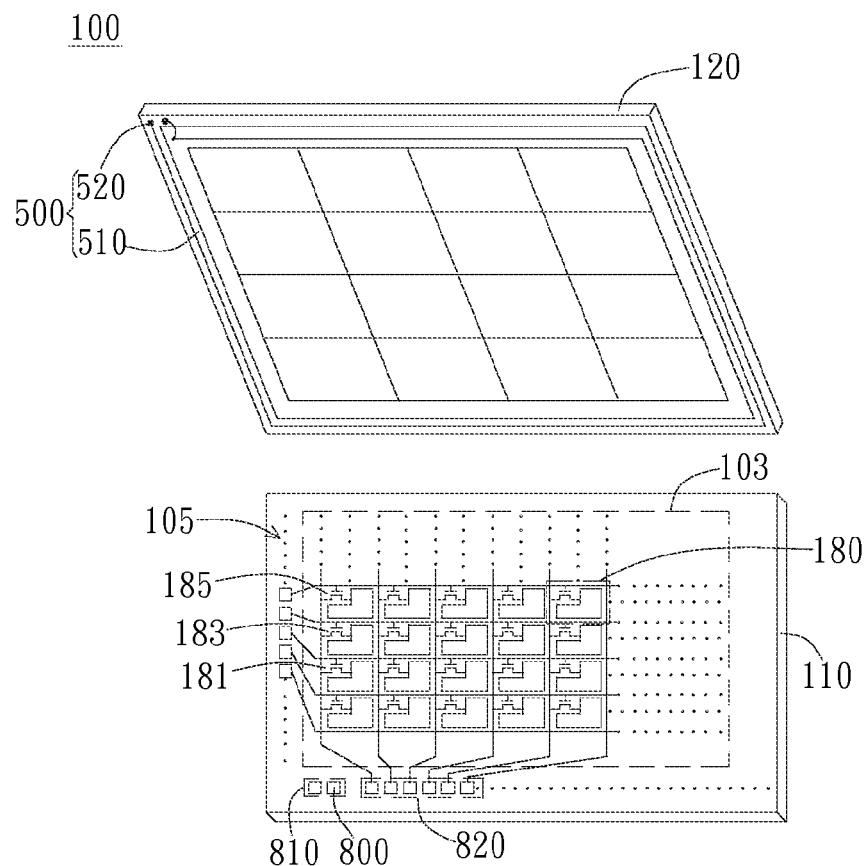
FIG. 8A is a schematic view of the embodiment having a sensing antenna disposed on the first substrate of the display panel.

FIG. 8A shows another embodiment of the display module of the present disclosure. As shown in FIG. 8A, the display module 10 includes a display panel 100 and a sensing antenna 500. The display panel 100 could be a non-self-luminous panel or a self-luminous panel. The display panel 100 preferably includes a first substrate 110, a second substrate 120, and a display medium layer 130 (referred to the FIG. 2 or 7A) disposed between the first substrate 110 and the second substrate 120. The display medium layer 130 could be a non-self-luminous material layer such as a liquid crystal layer, an electro-phoretic display layer, or an electro-wetting display layer. For a non-self-luminous panel, the backlight source of the backlight module must be disposed under the panel, i.e. the non-self-luminous panel is stacked on the backlight module. The display medium layer 130 could be a self-luminous material layer, such as organic luminous material layer or inorganic luminous material layer. The self-luminous panel does not need the backlight source of the backlight module. Besides, a display area 103 and a peripheral circuit area 105 surrounding the display area 103 can be defined or divided on the display panel 100. The display surface includes the display area and the peripheral circuit area, i.e. the surface of the display panel facing the user. The display area 103 includes a plurality of sub-pixels 180, wherein each sub-pixel 180 includes at least one signal wire 181, at least one pixel electrode 183, and at least one switching device (unit) 185 electrically coupled to the pixel electrode 183 and the signal wire 181, respectively. The signal wire 181, the pixel electrode 183, and the switching unit 185 are disposed on the first substrate 110. A color filter layer is preferably formed on the second substrate 120. In other embodiments, the color filter layer can be disposed on the first substrate 110 and on the switching unit 185 (which can be called as "color filter on array", COA) or under the switching unit 185 (which can be called "array on color filter", AOC). Moreover, the electrical field that drives the display medium layer of the non-self-luminous panel can be horizontal electrical field or/and vertical electrical field.

Figure 8B:
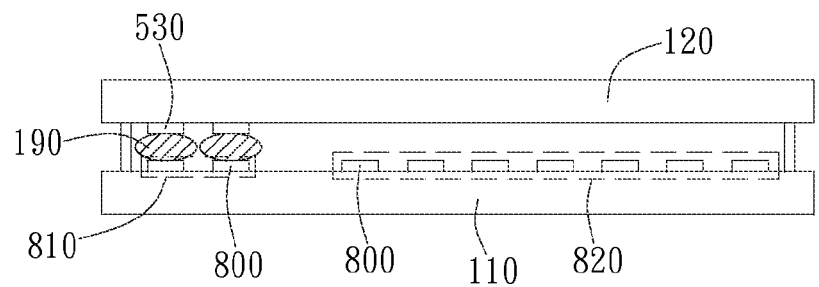
FIG. 8B is a cross-sectional view of the embodiment shown in FIG. 8A.

As shown in FIG. 8A, at least one sensing antenna 500 is disposed in at least a portion of the peripheral circuit area 105 and on the second substrate 120. Preferably, one or more sensing antennas 500 are disposed along the area of the peripheral circuit area 105. In this preferred embodiment, the sensing antenna 500 is disposed on an inner surface of the second substrate 120 facing the inner surface of the first substrate 110. In different embodiments, however, the sensing antenna 500 could be on the outer surface of the second substrate 120. Besides, the sensing antenna 500 preferably surrounds the display area 103 to form a loop antenna. A loop antenna could be formed by one or more sensing antennas 500, but forms at least a portion of the peripheral circuit area 105. The display module further includes a plurality of contact pads 800 disposed on the peripheral circuit area 105 and preferably on the first substrate 110. The contact pads 800 can be divided into a first group 810 and a second group 820. The contact pads 800 in the first group 810 are electrically coupled to the sub-pixels 180 in the display area 103 via the corresponding signal wires 181. The contact pads 800 in the second group 820 are preferably not electrically coupled to the sub-pixels 180, e.g. for testing or being reserved as dummy pads. Moreover, as shown in FIG. 8B, the display panel 100 further includes at least two conductive transfer devices (units) 190 disposed between the first substrate 110 and the second substrate 120. The conductive transfer unit 190 is preferably a conductive adhesive, a polymer coated with a conductive material on the surface, a conductive polymer, or other material alike, or a combination thereof. The conductive transfer units 190 are disposed in the peripheral circuit area 105 and are electrically coupled to the contact pads 800 in the second group 820 and the signal connecting terminal 530 of the sensing antenna 500 for transferring a signal from the wire on the first substrate 110 to the sensing antenna 500 on the second substrate 120, or transferring a signal received by the sensing antenna 500 to the wire on the first substrate 110 and then forwarding to the back terminal, e.g. via the signal connecting circuit module 700 connected to the first substrate 110 and further transferring to the system terminal. The sensing magnetic field line of the sensing antenna 500 is able to leave from the display surface of the display panel 100, i.e. the outer surface of the second substrate 120, to improve the sensing effect. On the other hand, in order to enable the magnetic field line of the sensing antenna 500 to leave from the rear shell 400 side, i.e. the outer surface of the first substrate 110, the approach can be found by referring to the above embodiments.

Figure 9:
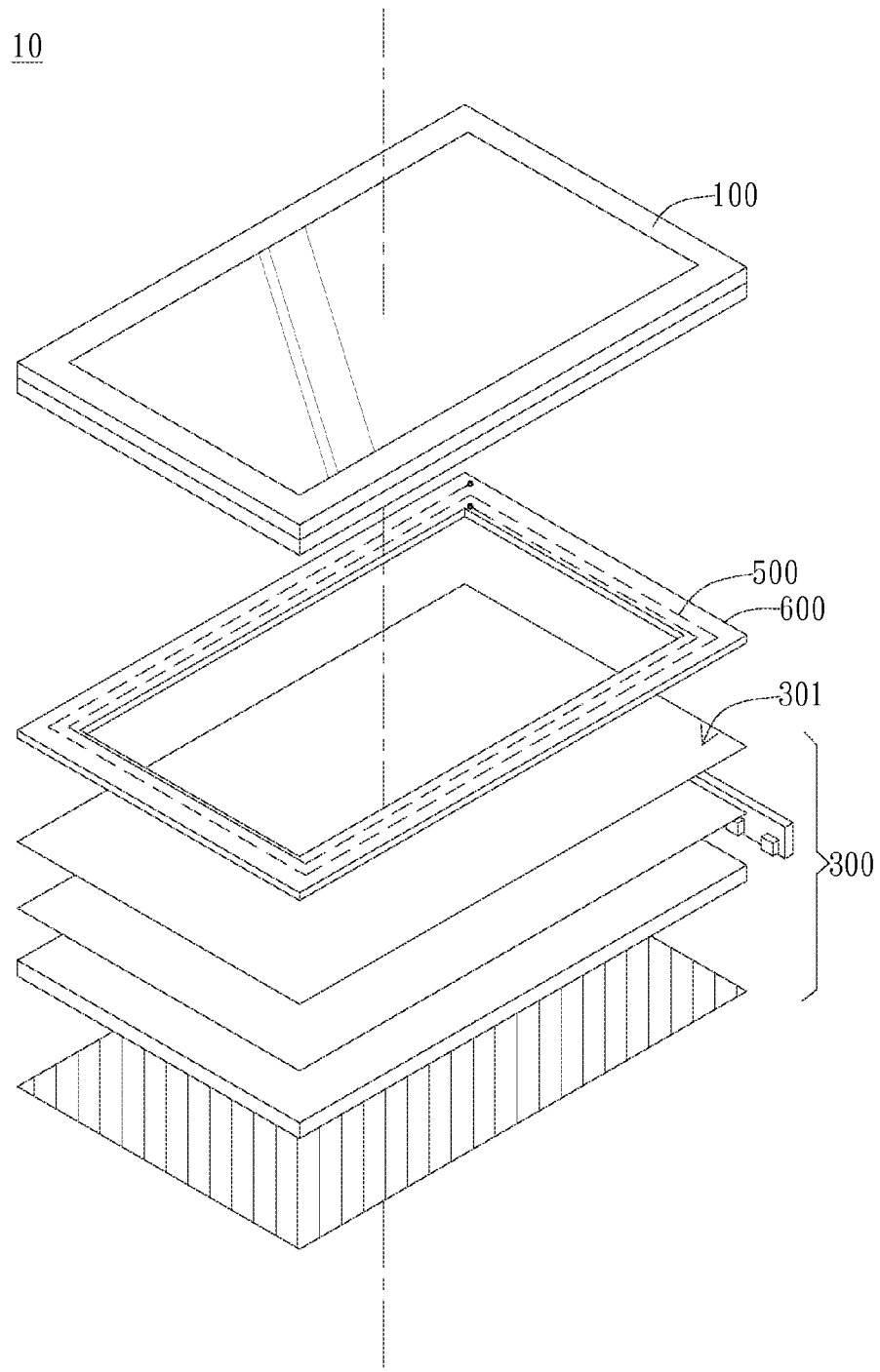
FIG. 9 is a schematic view of the embodiment of the display module including a carrier 600.

FIG. 9 is a schematic view of another embodiment of the present disclosure. In this embodiment, the display module includes a display panel 100, one or more carriers 600, and one or more sensing antennas 500. The display panel 100 is preferably a non-self-luminous display panel such as liquid crystal display panel. The carrier 600 overlaps a portion of display panel 100. For example, the carrier 600 surrounds the display panel 100, wherein the display panel 100 is preferably stacked on the carrier 600 by its back surface. The sensing antenna 500 could be disposed in the carrier 600 or between the carrier 600 and the display panel 100. The sensing antenna 500 is preferably formed as a loop coil, hence can be disposed along the carrier 600 and surrounds the display panel 100. Moreover, the display module preferably includes a backlight module 300 disposed on the back side of the display panel 100 if a non-self-luminous display module is illustrated; hence the carrier 600 is preferably partially disposed between the display panel 100 and the backlight module 300. The display module does not need a backlight module if a self-luminous display module is illustrated; hence the carrier 600 is disposed on the back side of the display panel 100.

As the embodiment shown in FIG. 9, the carrier 600 is disposed between the display panel 100 and the backlight module 300 as frame glue (or namely polymer layer). The backlight module 300 has a light exit surface 301, wherein the carrier 600 is disposed on the light exit surface 301 and distributed as a closed loop along the edge of the light exit surface 301. In other embodiments, the carrier 600 is not limited to a frame and could be straight line, L shape, or U shape. The back side of the display panel 100 is stacked on the carrier 600 and assembled with the backlight module 300 by the carrier 600. In this embodiment, the sensing antenna 500 includes a conductive adhesive layer (or namely conductive polymer layer, or namely conductive glue layer) to become a portion of the carrier 600 or to attach on the carrier

600. Besides, the sensing antenna 500 preferably is located in the projection plane of the display panel 100. In other embodiments, the sensing antenna 500 could be located outside the display panel or partially inside and partially outside the display panel. The conductive adhesive layer preferably includes organic polymer as a main component or the carrier and further includes conductive component. The material of the polymer is preferably selected from epoxy, organic silicone resin, polyimide resin, phenol resin, polyurethane, acrylic resin, a combination thereof, or other suitable materials, wherein the physical and chemical properties of the above polymer materials could be found in the MSDS. The conductive component is preferably selected from gold, silver, copper, aluminum, zinc, ferrous, nickel, graphite, a combination thereof, or other suitable materials or conductive compounds. Beside, an organic polymer can be used whether it is adhesive or not. The sensing magnetic field line of the sensing antenna 500 is able to leave the display surface of the display panel 100, hence to increase the sensing effect. For enabling the magnetic field line of the sensing antenna 500 to leave from the rear shell 400 side, the approach can be found by referring to the above embodiments.

Figure 10A:
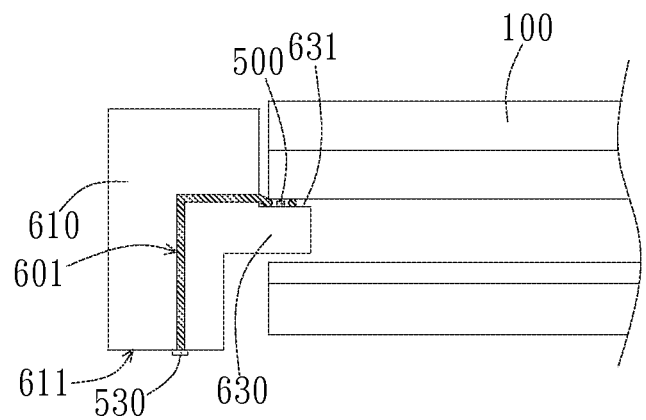
FIGS. 10A to 10C are variant embodiments of the embodiment of FIG. 9.

FIG. 10A shows a modified embodiment of the embodiment shown in FIG. 9. As the cross-sectional view shown in FIG. 10A, the carrier 600 includes a side wall 610 and a supporting flange 630 extending from the side wall 610 to a center of the display panel (or said to extend toward the display panel or extend along the horizontal plane). The supporting flange 630 is extend to the bottom surface of the display panel 100 from the edge of the display panel 100 to make the display panel 100 be stacked on the top surface 631 of the supporting flange 630 for supporting the display panel 100. As shown in FIG. 10A, the side wall 610 includes a bottom surface 611 preferably protruding out of the bottom of the supporting flange 630. In different embodiments, however, the bottom surface 611 aligns to the bottom of the supporting flange 630.

Figure 10B:
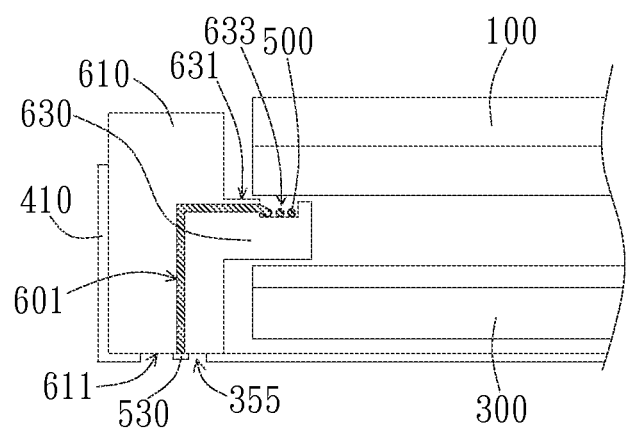

In the embodiment shown in FIG. 10A, the sensing antenna 500 is disposed between the carrier 600 and the display panel 100. More particularly, the sensing antenna 500 is disposed on the top surface 631 of the supporting flange 630 by attaching or other methods, or attached to the bottom surface of the display panel 100 corresponding to the position of the top surface 631 of the supporting flange 630. In different embodiments, as shown in FIG. 10B, a groove 633 can be formed on the top surface of the supporting flange 630, wherein the sensing antenna 500 is disposed in the groove 633. Moreover, a through hole 601 can be selectively formed in the supporting flange 630 and the side wall 610. A portion of the sensing antenna 500 can stretch into the through hole 601 for exposing the signal connecting terminal 530 from the bottom surface of the side wall 610. This design is benefit to the signal connection with the system terminal when the sensing antenna 500 is an active design. When the sensing antenna 500 is a passive design, the through hole 601 is not required to be disposed in the supporting flange 630 and the side wall 610. For the convenience of signal connection between the signal connecting terminal 530 and the system terminal, when the display module 100 includes a structural enhance device 410 (or called as shell, rear frame) disposed under the carrier 600 and covering the carrier 600 and the display panel 100, at least one opening 355 is formed in the shell 410 at a position of corresponding to the signal connecting terminal 530, so that the signal connecting terminal 530 can pass through the opening 355 to signal connect the system terminal.

Figure 10C:
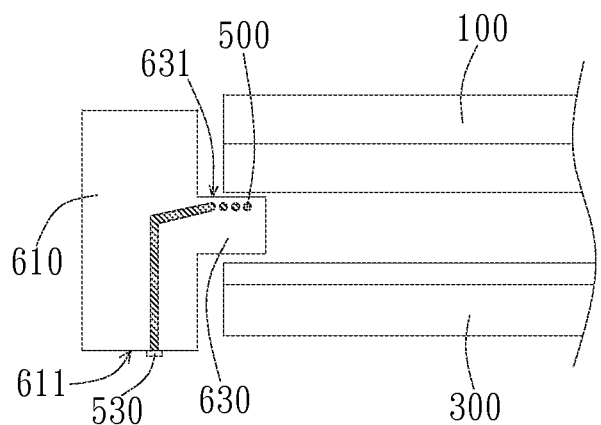

Another modified embodiment is shown in FIG. 10C. In this embodiment, the sensing antenna 500 can be embedded inside the carrier 600 by various processes such as in-mold injection and make the signal connecting terminal 530 exposed by the bottom surface of the side wall 610. With this design, the problem of aligning for attaching the sensing antenna 500 on the carrier can be avoided and the benefits described above are preserved. The sensing magnetic field line of the sensing antenna 500 is able to leave the display surface of the display panel 100, hence to increase the sensing effect. Furthermore, the embodiments shown in FIGS. 10A-10C preferably have a rear shell (or called casing, rear cover) 400 for covering the display module 100 and the carrier 600. For enabling the magnetic field line of the sensing antenna 500 to leave from the rear shell 400 side, the approach can be found by referring to the above embodiments.

Figure 11:
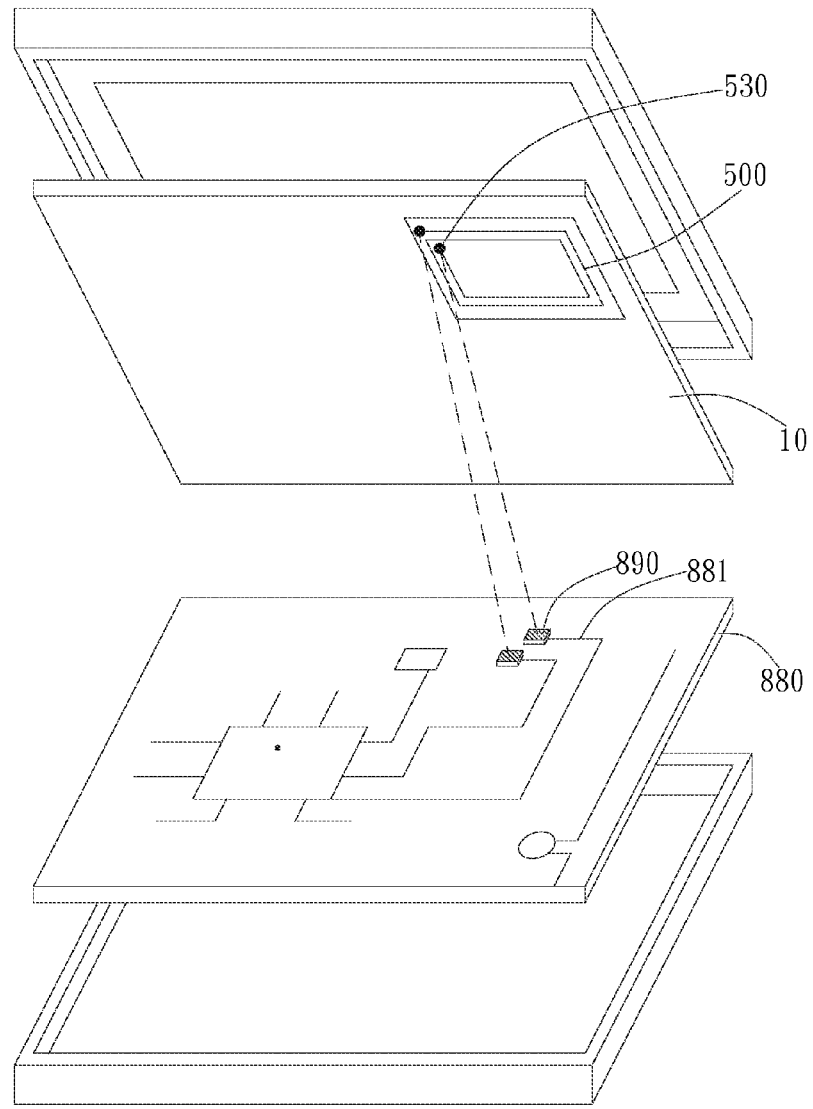
FIG. 11 is an exploded view of the embodiment of the electronic device.

FIG. 11 is an exploded view of the embodiment of the electronic device of the present disclosure. The electronic device preferably includes any of the above-mentioned display modules 10, a system circuit module 880, and a conductive transfer device (unit) 890. The system circuit module 880 is preferably disposed on a back side of the display module 10, i.e. the opposite side of the display surface 101. The system circuit module 880 preferably includes signal connecting part 881 disposed corresponding to the signal connecting terminal 530 of the sensing antenna 500. The conductive transfer units 890 are disposed between the system circuit module 880 and the sensing antenna 500, wherein the conductive transfer units 890 respectively electrically connect the corresponding signal connecting parts 881 and signal connecting terminals 530 for signal transfer. The conductive transfer unit 890 preferably includes various separable or non-separable electrically connecting interfaces such as connecting pad, connector, connecting terminal, and solder. In the preferred embodiment, since the location of the signal connecting part 881 corresponds to the location of the signal connecting terminal 530, if the thickness or the height of the conductive transfer unit 890 is properly selected, a contact along with an electrical connection are automatically formed simply by assembling the system circuit module 880 with the display module 10 when assembling the electronic device. The system circuit module 880 is preferably a rigid printed circuit board, wherein a soft circuit board also can be used. The sensing magnetic field line of the sensing antenna 500 is able to leave the display surface of the display panel 100, hence to increase the sensing effect.

Figure 12:
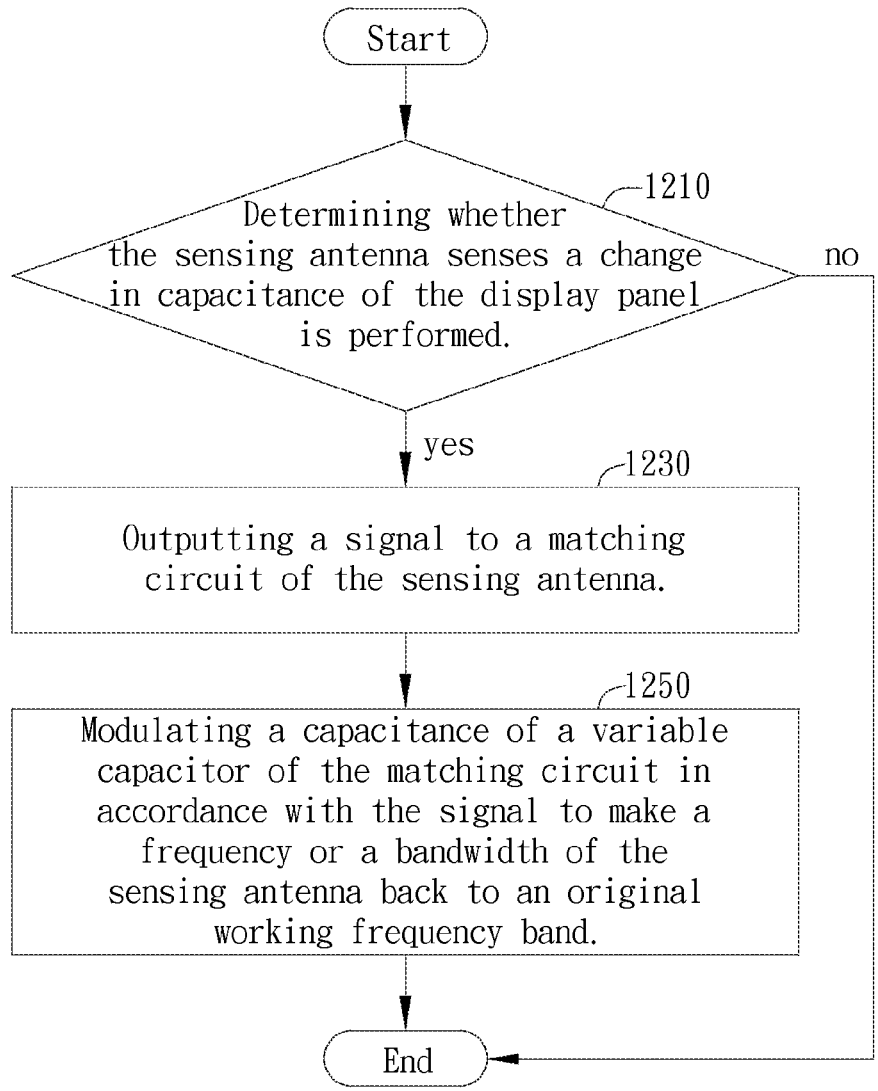
FIG. 12 is a flow chart of the method for decreasing interference to the sensing antenna of the present disclosure.

For decreasing interference to the frequency or the bandwidth of the sensing antenna 500 caused by a change in capacitance when operating the display panel, a modulation can be done by the steps shown in FIG. 12. First, in step 1210, a step of determining whether the sensing antenna 500 senses a change in capacitance of the display panel is performed. When a change in capacitance of the display panel 100 is sensed, a step of outputting a signal to a matching circuit of the sensing antenna 500 is performed in step 1230. In step 1250, a variable capacitor of the matching circuit of the sensing antenna 500 modulates the capacitance after receiving the signal to make a frequency or a bandwidth of the sensing antenna 500 back to an original working frequency or bandwidth, hence to reduce the effect caused by the change in capacitance of the display panel. With this design, even though the sensing antenna 500 is disposed in the display module 10, furthermore in the display panel 100, the sensing antenna 500 can operate normally with reduced interference.

Figure 1:
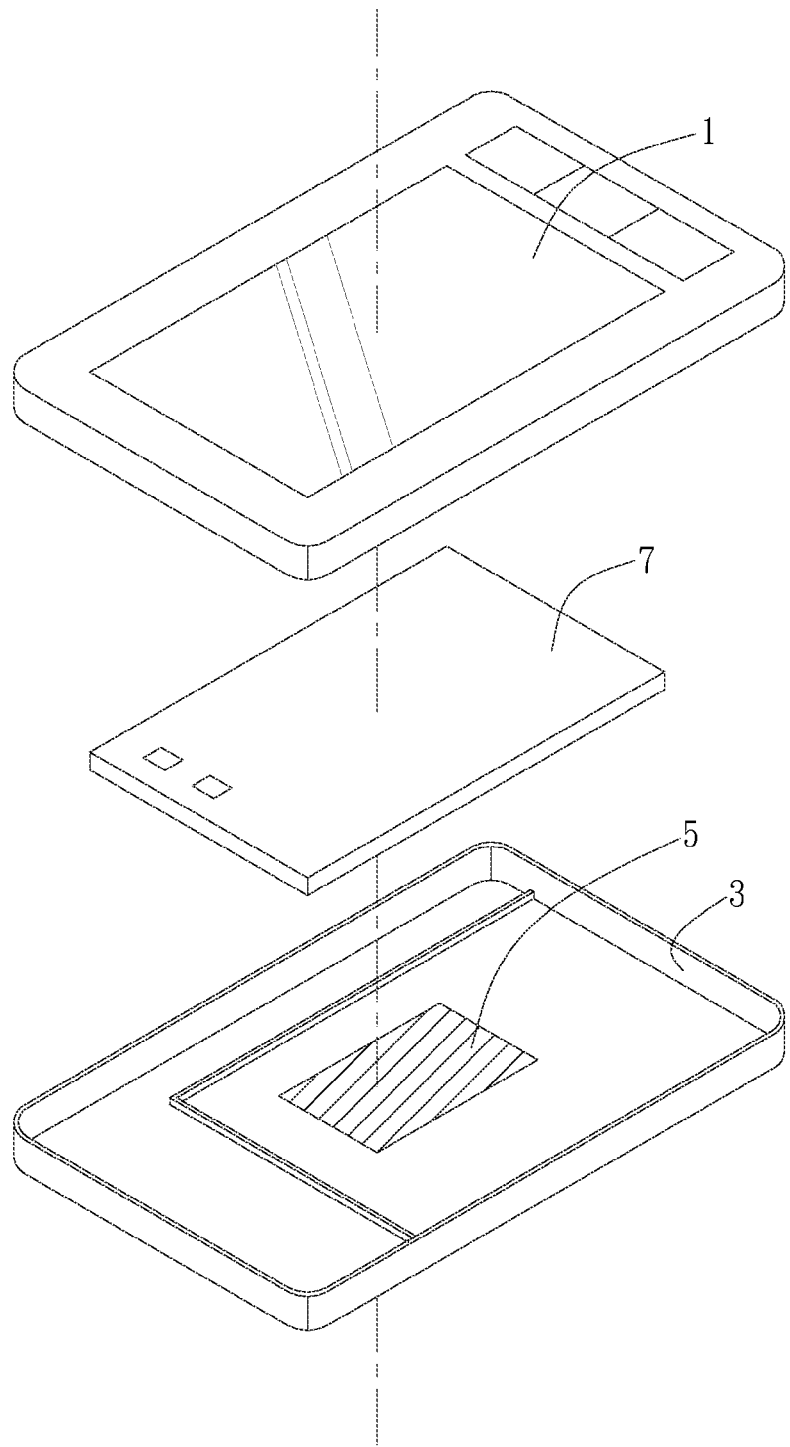
FIG. 1 is a schematic view of the comparative embodiment of the electronic device of the present disclosure.

FIG. 1 is a schematic view of the comparative embodiment of the present disclosure having a near field communication antenna disposed on the electronic device. The electronic device of the comparative embodiment includes a display module 1, a rear cover (or called as outer shell), a near field communication antenna 5, and a battery 7. As shown in FIG. 1, the near field communication antenna 5 is disposed in the inner surface of the rear cover 3; the battery 7 overlaps (or called as stacked on) the near field communication antenna 5 and is assembled with the display module 1 to form the electronic device. Since there exists a metal shielding effect due to the shielding of a metal component (layer) above the near field communication antenna 5, the sensing can be carried out from the side of rear cover 3 only, instead of from the display surface of the display module. However, comparing with the above-mentioned embodiments and the modified embodiments of the present disclosure, the comparative embodiment of sensing from the side of rear cover 3 does not comply with the usual practice of a general user and is inconvenient and disturbing, wherein the sensing magnetic field line is not strong or is unstable.

Although the preferred embodiments of the present disclosure have been described herein, the above description is merely illustrative. Further modification of the disclosure herein disclosed will occur to those skilled in the respective arts and all such modifications are deemed to be within the scope of the disclosure as defined by the appended claims.

What is claimed is:

1. A display module, comprising:
   a display panel;
   a backlight module having a light exit surface and a reflective plate opposite to the light exit surface, wherein the display panel is stacked on the light exit surface, wherein the reflective plate has a first surface and a second surface is opposite to the first surface, wherein the first surface of the reflective plate is disposed toward and close to the display panel, and the second surface of the reflective plate is disposed toward and far away the display panel; and
   at least one sensing antenna disposed below the second surface of the reflective plate, wherein the antenna has a body and two signal connecting terminals connecting the body, and when a sensing device approaches a display surface of the display panel, the sensing antenna senses and transmits or receives data via the display surface of the display panel to the sensing device approaches.

2. The display module of claim 1, further comprising at least one signal connecting circuit module and a rear shell, wherein the signal connecting circuit module provides signal to the display panel, wherein the rear shell covers the second surface of the reflective plate facing away from the light exit surface, wherein the signal connecting circuit module is disposed between the sensing antenna and the rear shell.

3. The display module of claim 1, further comprising a rear shell covering the second surface of the reflective plate facing away from the light exit surface, wherein the rear shell has at least one opening, wherein the opening at least partially exposes the sensing antenna.

4. The display module of claim 1, wherein the display panel includes the display surface having a metal layer, a portion of the display panel overlaps the sensing antenna and has an overlapping area when projecting on a plane, wherein a metal coverage rate of the metal layer in the overlapping area is not more than 90%.

5. The display module of claim 1, further comprising:
   a system circuit module disposed on a back side of the display module, wherein the system circuit module has two signal connecting parts;
   two conductive transfer devices disposed between the system circuit module and the sensing antenna, wherein the signal connecting parts are respectively connect the corresponding signal connecting terminals through the conductive transfer devices, wherein the display module, the system circuit module and the conductive transfer devices form an electronic device.

6. The display module of claim 1, wherein the reflective plate does not include metallic film or alloy film.

7. The display module of claim 1, wherein the backlight module further comprising a light guide plate, wherein the first surface of the reflective plate is disposed toward and close to the light guide plate and the second surface of the reflective plate is disposed toward and far away the light guide plate.

8. The display module of claim 1, wherein the sensing antenna consists of near field communication and/or inductive charging antenna.

9. The display module of claim 1, wherein a vertical distance between the display panel and the sensing antenna is greater than a vertical distance between the reflective plate and the display panel.

10. A display module, comprising:
    a display panel having a display surface and a bottom surface opposite to the display surface;
    at least one sensing antenna disposed on the bottom surface, wherein the sensing antenna includes a body and two signal connecting terminals respectively connected to two terminals of the body;
    wherein a portion of the display panel overlaps the sensing antenna and has an overlapping area when projecting on a plane, wherein a metal coverage rate of a metal layer in the overlapping area is not more than 90%;
    wherein the sensing antenna consists of near field communication and/or inductive charging antenna and when a sensing device approaches the display surface of the display panel, the sensing antenna senses and transmits or receives data via the display surface to the sensing device approaches.

11. The display module of claim 10, further comprising a backlight module disposed between the bottom surface and the sensing antenna.

12. The display module of claim 10, wherein the metal projection coverage rate is not more than 70%.

13. The display module of claim 10, wherein the sensing antenna includes a conductive glue layer and is in a projection plane of the display panel, wherein the conductive glue layer includes an organic polymer as a main component and a conductive component.

14. The display module of claim 10, wherein the sensing antenna is disposed inside a carrier or between the carrier and the display panel, wherein the carrier is disposed under the display panel, wherein the display panel is stacked on the carrier.

15. The display module of claim 14, wherein the carrier includes a side wall and a supporting flange extending from the side wall to a center of the display module, the supporting flange has a top surface supporting the display panel, a bottom surface of the side wall aligning to or protruding out of a bottom surface of the supporting flange.

16. The display module of claim 15, wherein the sensing antenna is disposed between the carrier and the display panel, wherein the sensing antenna has a signal connecting terminal exposed on the bottom surface of the side wall.

17. The display module of claim 15, wherein the sensing antenna is disposed inside the carrier and has a signal connecting terminal exposed on the bottom surface of the side wall.

18. The display module of claim 16, further comprising a casing disposed under the carrier for accommodating the carrier and the display panel, wherein at least one opening is formed at a position of the casing corresponding to the signal connecting terminal.

19. The display module of claim 17, further comprising a casing disposed under the carrier for accommodating the carrier and the display panel, wherein at least one opening is formed at a position of the casing corresponding to the signal connecting terminal.

20. The display module of claim 10, wherein the reflective plate does not include metallic film or alloy film.

21. The display module of claim 11, wherein a vertical distance between the display panel and the sensing antenna is greater than a vertical distance between the backlight module and the display panel.

22. The display module of claim 10, wherein the display panel has the metal layer, wherein the metal layer includes a signal transfer device or line.

23. The display module of claim 22, wherein the signal transfer device or line includes at least one of a scanning line, a data line, a capacitor line, a connecting wire, a contact pad, a transistor, a power wire, a reference potential wire, a reflective electrode, a repairing wire, and a capacitor electrode.

24. A display module, comprising:
a display panel;
a signal connecting circuit module connected to one end of the display panel, wherein the signal connecting circuit module has a plurality of driving signal wires for transferring signals to the display panel; and
at least one sensing antenna disposed on the signal connecting circuit module;
wherein the sensing antenna includes a body and two signal connecting terminals respectively connecting the body, wherein the sensing antenna is electrically insulated from the driving signal wires, and the signal connecting circuit module includes a first circuit board and a second circuit board.

25. The display module of claim 24, wherein the first circuit board is a portion of the signal connecting circuit module, and the second circuit board is another portion of the signal connecting circuit module, and the first circuit board and the second circuit board are formed the signal connecting circuit module.

26. The display module of claim 24, wherein the second circuit board is attached on the first circuit board, wherein at least one portion of the second circuit board is in a projection plane of the first circuit board.

27. The display module of claim 24, wherein a gap exists between same ends of the first circuit board and the second circuit board for separating the first circuit board from the second circuit board.

28. The display module of claim 24, further comprising a backlight module stacked with the display panel, wherein the sensing antenna is folded backward to the back side of the backlight module along with a portion of the signal connecting circuit module board.

29. The display module of claim 24, wherein the signal connecting circuit module includes a system terminal connector, the driving signal wire and the sensing antenna share the system terminal connector to transfer signal.

30. The display module of claim 24, wherein the display panel includes a first substrate, a second substrate, and a display medium layer disposed between the first substrate and the second substrate, wherein the signal connecting circuit module includes a first face and a second face opposite to the first face, the first face of the signal connecting circuit module faces the inner surface of the first substrate, wherein the sensing antenna is disposed on the second face of the signal connecting circuit module.

31. The display module of claim 24, wherein the signals transferred by the plurality of driving signal wires are adapted for the display panel to display images.

32. A display module, comprising:
a display panel including a first substrate, a second substrate, a display medium layer disposed between the first substrate and the second substrate, wherein a display area and a peripheral circuit area are defined on the display panel, the display area includes a plurality of sub-pixels, wherein each sub-pixel includes at least one signal wire, at least one pixel electrode, and at least one switching unit electrically coupled to the pixel electrode and the signal wire respectively, wherein the signal wire, the pixel electrode, and the switching unit are disposed on the first substrate;
a plurality of contacting pads disposed on the peripheral circuit area and on the first substrate; and
at least one sensing antenna disposed on at least one portion of the peripheral circuit area and on the second substrate, wherein the sensing antenna includes a body and two connected terminals respectively connect the body.

33. The display module of claim 32, wherein the contacting pads includes a first group electrically coupled to the sub-pixels and a second group having two contacting pads and not electrically coupled to the sub-pixels; the display panel further including:
two conductive transfer devices disposed between the first substrate and the second substrate and are in the peripheral circuit area, wherein the connecting terminals connect the contacting pads of the second group via the conductive transfer devices.

34. The display module of claim 32, further comprising a signal connecting circuit board having a plurality of conducting wires, wherein the signal connecting circuit board is disposed on the first substrate, wherein the conducting wires connect the contact pads.

35. The display module of claim 33, further comprising a signal connecting circuit board having a plurality of conducting wires, wherein the signal connecting circuit board is disposed on the first substrate, wherein the conducting wires connect the contact pads.

36. The display module of claim 32, further includes a backlight module stacked on the display panel.

37. A display module, comprising:
a display panel having a display surface and a bottom surface opposite to the display surface;
at least one sensing antenna disposed below the bottom surface of the display panel, wherein the sensing antenna includes a body and two signal connecting terminals respectively connected to two terminals of the body; and
a module has a surface and another surface is opposite to the surface, and the surface of the module is disposed toward and close to the bottom surface of the display panel, and the another surface of the module is disposed toward and far away the bottom surface of the display panel, and the sensing antenna is disposed below the module.

38. The display module of claim 37, wherein when a sensing device approaches the display surface of the display panel, the sensing antenna senses and transmits or receives data via the display surface of the display panel to the sensing device approaches.

39. The display module of claim 37, wherein a vertical distance between the display panel and the sensing antenna is greater than a vertical distance between the module and the display panel.

40. The display module of claim 37, wherein the module has at least one of a backlight module or an electrical module.

41. The display module of claim 40, wherein the backlight module having a light exit surface and a reflective plate opposite to the light exit surface, wherein the display panel is stacked on the light exit surface, wherein the reflective plate has a first surface and a second surface is opposite to the first surface, wherein the first surface of the reflective plate is disposed toward and close to the display panel, and the second surface of the reflective plate is disposed toward and far away the display panel.

42. The display module of claim 41, wherein a vertical distance between the display panel and the sensing antenna is greater than a vertical distance between the reflective plate and the display panel.

43. The display module of claim 41, wherein the backlight module further comprising a light guide plate, wherein the first surface of the reflective plate is disposed toward and close to the light guide plate and the second surface of the reflective plate is disposed toward and far away the light guide plate.

44. The display module of claim 37, further comprising a casing is adapted to accommodate the display panel and the sensing antenna.

45. The display module of claim 37, wherein the sensing antenna consists of near field communication and/or inductive charging antenna.

46. A display module, comprising:
a display panel having a display surface and a bottom surface opposite to the display surface;
at least one sensing antenna disposed below the bottom surface of the display panel, wherein the sensing antenna includes a body and two signal connecting terminals respectively connected to two terminals of the body; and
a signal connecting circuit module connected to one end of the display panel, wherein the signal connecting circuit module has a plurality of driving signal wires for transferring signals to the display panel, and the sensing antenna disposed on the signal connecting circuit module, wherein the signal connecting circuit module includes a first circuit board and a second circuit board.

47. The display module of claim 46, wherein when a sensing device approaches the display surface of the display panel, the sensing antenna senses and transmits or receives data via the display surface of the display panel to the sensing device approaches.

48. The display module of claim 46, wherein the first circuit board is a portion of the signal connecting circuit module, and the second circuit board is another portion of the signal connecting circuit module, and the first circuit board and the second circuit board are formed the signal connecting circuit module.

49. The display module of claim 46, wherein the second circuit board is attached on the first circuit board, wherein at least one portion of the second circuit board is in a projection plane of the first circuit board.

50. The display module of claim 46, wherein a gap exists between same ends of the first circuit board and the second circuit board is adapted to separate the first circuit board from the second circuit board.

* * * * *